United States Patent [19]

Shukuri et al.

[11] Patent Number: 4,716,127
[45] Date of Patent: Dec. 29, 1987

[54] METHOD OF IMPLANTING SPATIALLY CONTROLLED P-N JUNCTIONS BY FOCUSED ION BEAMS CONTAINING AT LEAST TWO SPECIES

[75] Inventors: Shoji Shukuri, Koganei; Masao Tamura, Tokorozawa; Yasuo Wada; Yoshihisa Fujisaki, both of Tokyo, all of Japan

[73] Assignee: Hitachi, Ltd., Tokyo, Japan

[21] Appl. No.: 852,317

[22] Filed: Apr. 15, 1986

[30] Foreign Application Priority Data

Apr. 15, 1985 [JP] Japan .................................. 60-78347

[51] Int. Cl.$^4$ .................... H01L 21/265; G01N 23/00
[52] U.S. Cl. .................................... 437/27; 250/492.1; 250/492.2; 357/91; 427/38; 437/20; 437/22; 437/987; 437/930
[58] Field of Search .......................... 29/576 B, 576 L; 148/1.5, 187; 427/38; 357/91; 250/492.1, 492.2, 492.3

[56] References Cited

U.S. PATENT DOCUMENTS

| 4,385,946 | 5/1983 | Finegan et al. | 148/175 |
| 4,481,042 | 11/1984 | Takigawa et al. | 148/1.5 |
| 4,533,831 | 8/1985 | Itoh et al. | 250/492.2 |
| 4,556,798 | 12/1985 | McKenna et al. | 250/492.2 |

FOREIGN PATENT DOCUMENTS 0165717  8/1985  Japan .......................... 148/DIG. 83

OTHER PUBLICATIONS

Miyaguchi et al. Jap. Jour. Appl. Phys. 22, (4983), p. L225.
Reuss et al. J. Vac. Sci. Technol. B4 (1986) p. 290.

Primary Examiner—Upendra Roy
Attorney, Agent, or Firm—Antonelli, Terry & Wands

[57] ABSTRACT

A desired part of a workpiece is irradiated with a focused ion beam which contains at least two species of impurity ions to-be-implanted exhibiting different spacial distributions of ion current densities.

Thus, regions respectively implanted with different species of impurity ions can be formed in a predetermined positional relationship at high precision.

14 Claims, 8 Drawing Figures

METHOD OF IMPLANTING SPATIALLY CONTROLLED P-N JUNCTIONS BY FOCUSED ION BEAMS CONTAINING AT LEAST TWO SPECIES

BACKGROUND OF THE INVENTION

The present invention relates to a method of manufacturing a semiconductor device. More particularly, it relates to a method of manufacturing a semiconductor device which can introduce a plurality of species of impurities into a desired part without employing a mask.

Heretofore, in case of forming a minute low resistive region by introducing an impurity into a semiconductor by the use of ion implantation, impurity ions have been implanted into a desired region by employing $SiO_2$ or resist for a mask and irradiating the region with an ion beam about 1 cm in diameter. Needless to say, it is preferable for the higher density of integration of semiconductor elements that an impurity doped region is rendered as small as possible. Besides, in a case where P-type impurity ions and N-type impurity ions need to be implanted using respectively different masks as in case of forming minute periodic P-N junctions in a lateral direction within a semiconductor substrate, the registration accuracy between the masks becomes a problem. For example, the registration accuracy between the masks which is attained when electron beam lithography is employed is limited to approximately 0.15 μm for 3 σ.

With a prior art consisting of the lithographic processing of the masks and the ion implantation, accordingly, it has been impossible in view of the registration accuracy between the masks to form the lateral periodic P-N junctions which have pitches of, for example, 0.1 μm or less.

In this manner, the method of manufacturing a semiconductor device which carries out the conventional ion implantation has hindered enhancement in the integration density of semiconductor elements.

In recent years, however, a technique is being developed wherein, as reported in 'Japanese Journal of Applied Physics', Vol. 22, No. 5, 1983, PL287, ions are implanted into a semiconductor substrate with an impurity ion beam focused to a very small diameter, thereby to form a minute impurity-doped region which has a size nearly equal to the beam diameter. This is based on the fact that liquid metal ion sources from which ions, for example, $B_+$ and $As_{30}$ or $Si^+$ and $Be^+$ can be extracted at high brightness have been developed, so it has become possible to readily focus the ions to a diameter of 0.1 μm or less. The circumstances of the developments of such liquid metal ion sources and the applications thereof to semiconductor processes are described in detail in, for example, "Ion Beam/Extensive Applications to Next Generation Process Technology" by Toshio TSURUSHIMA, 'Science and Technology in Japan', July–August, vol. 25, No. 228, 1984, pp. 48–55.

With the focused ion beam, an impurity can be introduced into a minute region within 0.1 μm. However, in case of implanting the ions of another impurity into a region adjacent to the above region, it poses a problem that the positioning accuracy of the ion beams is inferior, so both the species of ions cannot be precisely implanted into the respective predetermined positions. This corresponds to the problem of the registration accuracy between the masks in the case of the conventional ion implantation and forms one serious problem in the practical application of the ion beams.

SUMMARY OF THE INVENTION

An object of the present invention is to solve the problem of the prior art described above, and to provide a method of manufacturing a semiconductor device which can readily implant ions into a very small desired region at a high positional accuracy.

The present invention for accomplishing the object is characterized by employing a focused ion beam which contains two or more species of impurity ions and which is so formed that the spatial distributions of ion current densities of the respective species are different. FIGS. 1a and 1b are diagrams for explaining the principle of the present invention. A very fine focused ion beam 1 which consists of $X_+$ and $Y^+$ ions (the ions may well be of three or more species) having different spatial distributions of ion current densities as shown in FIG. 1a is projected on a semiconductor substrate 2, whereby a plurality of implanted layers X and Y positioned to each other in self-alignment fashion are formed as shown in FIG. 1b.

DETAILED DESCRIPTION OF THE PREFERRED EMBODIMENTS

Figure 1A:
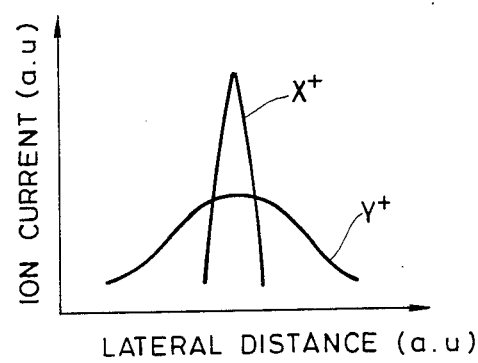
FIGS. 1a and 1b are diagrams for explaining the principle of the present invention.
Figure 1B:
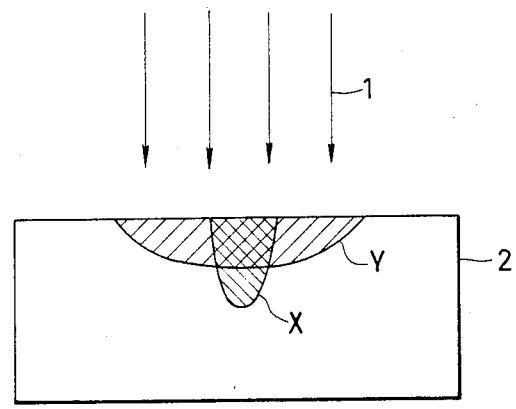
Figure 2:
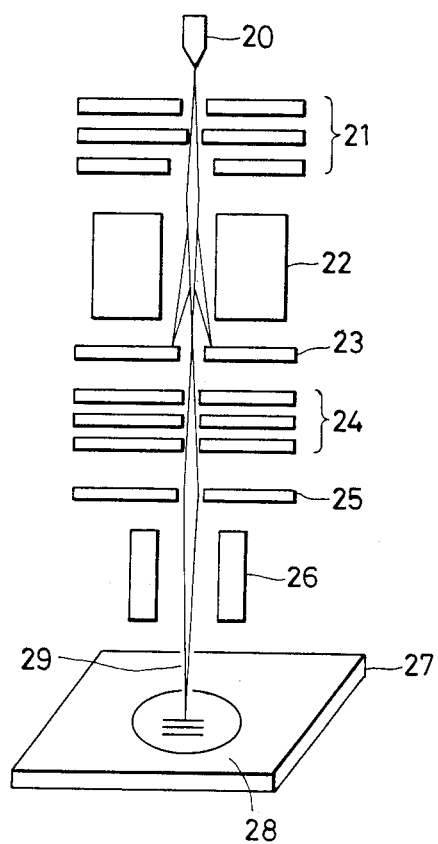
FIG. 2 is a view showing the setup of a focused ion beam apparatus for use in the performance of the present invention.
Figure 3A:
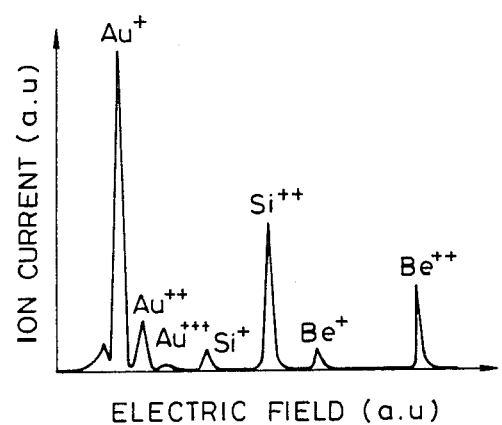
FIGS. 3a and 3b and FIG. 4 are diagrams each showing an example of the mass spectra of ions.
Figure 3B:
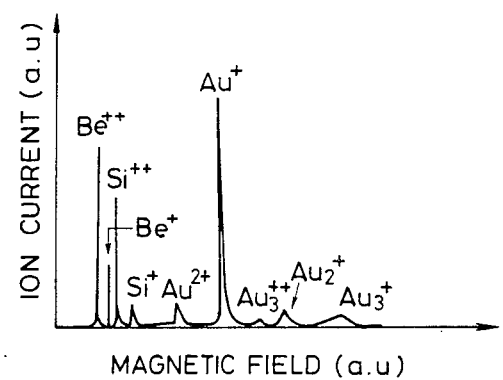
Figure 4:
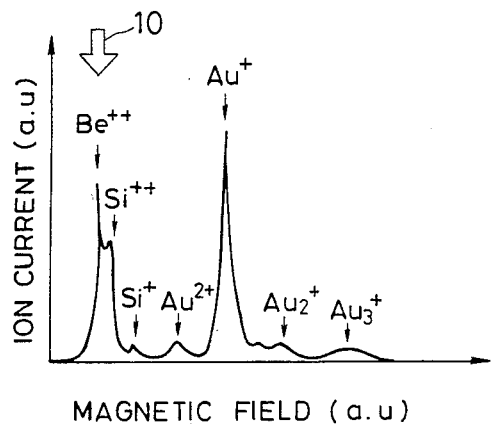
Figure 5:
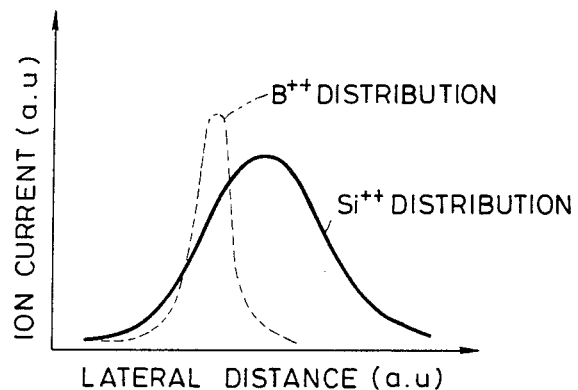
FIG. 5 is a diagram showing an example of the spatial distribution of ions.

In order to obtain the focused ion beam of a desired impurity, a focused ion beam apparatus as shown in FIG. 2 is used. Referring to the figure, numeral 20 designates a liquid metal ion source whose material to be ionized is an alloy containing a desired impurity, numeral 21 a condenser lens assembly, numeral 22 a mass separator which serves to separately derive only the ions of the desired impurity among impurity ions extracted from the liquid metal ion source 20, numeral 23 a first aperture, numeral 24 an objective lens assembly, numeral 25 a second aperture, numeral 26 an electrostatic deflector for deflecting a beam, numeral 27 a workpiece holder, numeral 28 a workpiece, for example, semiconductor substrate, and number 29 a focused ion beam. An electric field and a magnetic field which are orthogonal to the ion beam and orthogonal to each other are applied to the mass separator 22, whereby the beam is deflected in correspondence with the charge/mass ratio of the ions so as to pass only the desired ion species through the first aperture 23. When a material containing a plurality of species of impurities is employed as the material to-be-ionized, an ion beam containing a plurality of species of ions can be formed, and the plurality of species of ions can be simultaneously implanted. For example, in case of employing a Be-Si-Au alloy as the material to-be-ionized, mass spectra as shown in FIGS. 3a and 3b are obtained. FIG. 3a shows the mass spectrum obtained when the electric field is varied, and FIG. 3b the mass spectrum obtained when the magnetic field is varied. In this regard, by (1) enlarging the diameter of the first aperture 23 or shortening the distance between the first aperture 23 and the mass separator 22 or (2) accelerating the ions in the traveling direction of the beam within the mass separator 22, the mass resolving power lowers, and a plurality of proximate spectra can be turned into a single spectrum. When the case illustrated in FIG. 3b is taken as an example, a mass spectrum shown in FIG. 4 can be realized by such processing. Referring to FIG. 4, when the spectra of a part indicated by an arrow 10 are taken out, an ion beam simultaneously containing $Be^{++}$, $Be^{+}$ and $Si_{++}$ is obtained. When this ion beam is focused by the objective lens assembly at the lower stage, the respective ion species exhibit different spatial distributions of ion current densities because they have different energy distributions. FIG. 5 schematically illustrates the spatial distributions of ion current densities in this case. When the focused ion beam thus formed is vector-scanned and projected on a GaAs substrate, an impurity doped region in which the lateral concentration distributions of Be and Si are different can be formed by one linear scanning.

Since Be and Si act as a P-type impurity and an N-type impurity in GaAs respectively, a minute P-N junction can be formed in the lateral direction by the focused ion beam implantation stated above. In addition, when the focused ion beam is raster-scanned and projected on the GaAs substrate, periodic P-N junctions having minute pitches can be formed, and this produces a very great technical effect.

Figure 6:
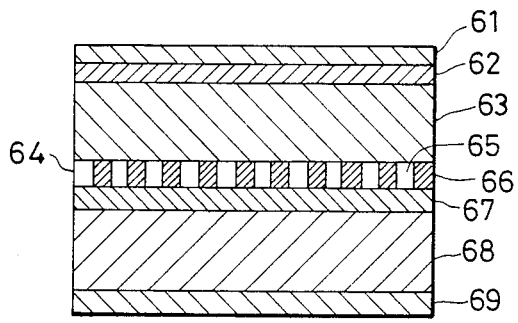
FIG. 6 is a view showing the sectional structure of a distributed feedback type semiconductor laser with an optical guide layer, which has been formed by applying the present invention.

FIG. 6 is a view showing the section of a distributed feedback type semiconductor laser with an optical guide layer to which the present invention is applied. An undoped InGaAs active layer 67 being about 0.1 μm thick and an N-type InGaAs optical guide layer 64 being about 0.2 μm thick were epitaxially grown on an N-type InP substrate 68 being about 100 μm thick. Thereafter, a focused ion beam containing $Si_{++}$ and $Be^{++}$, which had an acceleration energy of 50–100 keV and a beam diameter of 0.1 μm, is raster-scanned at pitches of 0.2 μm, whereby the ions were implanted within a dose range of $10^{12}$–$10^{13}$ ions/cm$^2$ to form $Si^{++}$ ion-implanted layers 65 and $Be^{++}$ ion-implanted layers 66. Thereafter, a P-type InP clad layer 63 being about 3 μm thick and a P-type InGaAsP cap layer 62 being about 0.3 μm thick were epitaxially grown, and a P-type electrode 61 and an N-type electrode 69 were formed. Thus, a laser device was fabricated.

By furnishing the optical guide layer 64 with the periodical P-N junction structure as described above, P-type carriers injected from the P-type electrode 61 are concentrated in the P-type regions 66 of low potential difference, so that the carrier density of the InGaAsP active layer 67 directly under the regions rises, and the effective refractive index thereof decreases. To the contrary, the carrier density lowers directly under the N-type regions 65, and the effective refractive index increases in this portion.

While, in a conventional distributed feedback type semiconductor laser, the effective refractive index has been endowed with a periodical distribution by the periodical change of the thickness of a light emitting layer or an optical guide layer, the periodical P-N junction structure formed by the use of the present invention can establish a great effective index difference and can fabricate a single-wavelength laser. According to the present invention, the periodical P-N junction structure of pitches of 0.2 μm which has not been realizable with the prior art can be formed by one time of ion implantation, and this is very effective as a method of manufacturing a semiconductor device having a minute structure.

As described above, the present invention implants ions by the use of a focused ion beam containing a plurality of species of impurity ions, thereby making it possible to introduce a plurality of impurities into a minute region by one time of ion implantation without the positioning of ion beams. The invention can form, for example, a periodical P-N junction structure at pitches of 0.2 μm not having been realizable with the prior art, and the effect thereof is remarkable as a method of manufacturing future semiconductor devices having dimensions of the submicron order.

This invention is not restricted only to the implantation of $Si^{+}$ and $Be^{+}$ into GaAs mentioned in the foregoing embodiment, but it is of course similarly applicable to a case of implanting different species of impurity ions into another semiconductor substrate in a similar way, such as a case of implanting boron ($B^{+}$) and arsenic ($As^{+}$) into silicon (Si).

What is claimed is:

1. A method of manufacturing a semiconductor device comprising the step of irradiating a desired part of a workpiece with a focused ion beam which contains at least two species of impurity ions to be simultaneously implanted, thereby to simultaneously implant said at least two species of impurity ions into said desired part, the at least two species having spatial distributions of ion current density within the focused ion beam that are different from each other.

2. A method of manufacturing a semiconductor device as defined in claim 1, wherein said at least two species of impurity ions afford conductivity types opposite to each other within a semiconductor material, whereby at least one p-n junction is formed at said desired part of the workpiece.

3. A method of manufacturing a semiconductor device as defined in claim 1, wherein a liquid metal ion source for said focused ion beam is an alloy which contains the at least two species of impurities to-be-ion-implanted.

4. A method of manufacturing a semiconductor device as defined in claim 1, wherein a region into which a first species of impurity ions in said at least two species of impurity ions are implanted has a predetermined positional relation to a region into which a second species of impurity ions in the same are implanted.

5. A method of manufacturing a semiconductor device as defined in claim 1, wherein the step of irradiating includes a sub-step of forming a single mass spectrum containing said at least two species of impurity ions to be simultaneously implanted.

6. A method of manufacturing a semiconductor device as defined in claim 1, wherein the step of irradiating includes vector-scanning and projecting the focused ion beam on said desired part of the workpiece.

7. A method of manufacturing a semiconductor device as defined in claim 1, wherein the at least two species of impurity ions are simultaneously implanted into said desired part so as to provide impurity doped regions in which the lateral concentration distributions of the at least two species of impurity ions are different.

8. A method of manufacturing a semiconductor device as defined in claim 1, wherein the step of irradiating includes raster-scanning and projecting the focused ion beam on said desired part of the workpiece.

9. A method of manufacturing a semiconductor device as defined in claim 5, wherein said sub-step of forming a single mass spectrum includes forming an initial ion beam including said at least two species of impurity ions, said initial ion beam comprised of a plurality of proximate spectra, and turning said plurality of proximate spectra into said single mass spectrum.

10. A method of manufacturing a semiconductor device as defined in claim 8, wherein said at least two species of impurity ions afford conductivity types opposite to each other within a semiconductor material, whereby, due to said raster-scanning and projecting, periodic p-n junctions are formed in the workpiece.

11. A method of manufacturing a semiconductor device as defined in claim 9, wherein an ion beam containing at least said at least two species of impurity ions is passed through a mass separator prior to contacting said desired part of a workpiece, and wherein said turning said plurality of proximate spectra into said single mass spectrum includes accelerating the ions, in their direction of travel, in the mass separator.

12. A method of manufacturing an optical guide layer of a semiconductor laser, comprising the steps of growing a layer of semiconductor material for said optical guide layer on an active layer of said semiconductor laser; and irradiating said layer of semiconductor material with a focused ion beam containing at least two species of impurity ions to be simultaneously implanted, so as to simultaneously implant the at least two species in the layer of semiconductor material, the at least two species having spatial distributions of ion current density within the focused ion beam that is different from each other, the at least two species of impurity ions affording conductivity types opposite to each other within said layer of semiconductor material, and the irradiating including raster-scanning the focused ion beam so as to provide periodic p-n junctions in said layer of semiconductor material.

13. A method of manufacturing an optical guide layer of a semiconductor laser as defined in claim 12, wherein said active layer is of undoped InGaAs, and said layer of semiconductor material is N-type InGaAs.

14. A method of manufacturing an optical guide layer of a semiconductor laser as defined in claim 12, comprising the further steps of forming a clad layer on the irradiated layer of semiconductor material, so as to provide a laminate structure, and forming a pair of electrodes respectively on opposed exposed surfaces of said laminate structure, whereby a semiconductor laser is formed.

15. A method of manufacturing an optical guide layer of a semiconductor laser as defined in claim 13, wherein said step of growing said layer of semiconductor material includes epitaxially growing said layer on said active layer.

* * * * *